Nov. 6, 1962 I. HOROWITZ 3,063,020

TRANSISTOR AMPLIFIER SYSTEM

Filed March 24, 1959

INVENTOR
IRVING HOROWITZ

BY Rines and Rines

ATTORNEYS

United States Patent Office 3,063,020
Patented Nov. 6, 1962

3,063,020
TRANSISTOR AMPLIFIER SYSTEM

Irving Horowitz, Eatontown, N.J., assignor to Blonder Tongue Electronics, Newark, N.J., a corporation of New Jersey Filed Mar. 24, 1959, Ser. No. 801,629
3 Claims. (Cl. 330—12)

Figure 1:
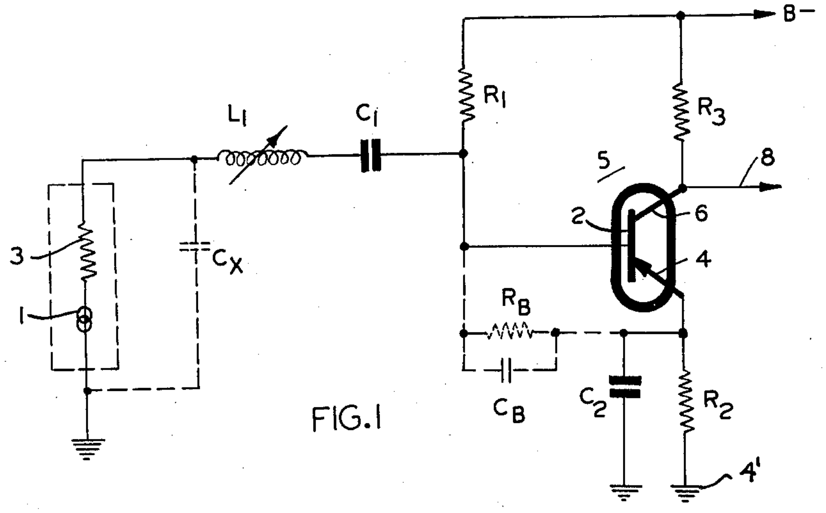

The present invention relates to transistor amplifier circuits, and, more particularly, to amplifier circuits adapted for use with substantially constant-current signal sources, such as television vidicon pickup-devices, and the like.

In circuits employing vidicon and similar substantially constant-current signal sources, it has been customary to employ a large input resistance for the purpose of generating relatively high voltages at low frequencies that may override microphonic noise generally produced in the first amplifier stage. The use of such high input resistance, however, inherently makes it difficult, if not impossible, to broad-band-peak the high frequencies. This is because the reactance of the input circuit capacitance is low compared to the load resistance to obtain broad-band peaking. The art has thus had to content itself with improvement of the signal-to-noise ratio at the low frequencies only. Inverse networks have been employed in subsequent circuits, however, to boost the high frequencies.

This same approach has also been applied to transistorized amplifier stages for vidicons and other substantially constant-current sources. The transistor, of course, has a relatively low input resistance, so that it has been conventional to employ as the first input stage from the vidicon or other source, an emitter-follower stage having a grounded collector. With an emitter-load resistor of the order of, say, 1500 ohms, and a current gain $\beta$ of the order of 60, an effective input resistance of the order of 90,000 ohms may be obtained for the low frequencies, providing low-frequency boosting.

It has been found, however, that the noise produced in the input transistor amplifier stage substantially corresponds to that which would result if an equivalent effective noise generator were connected in series circuit with the base-to-emitter resistance, between the base and the emitter. If the impedance of the base-driving source becomes comparable to or greater than the base-to-emitter resistance itself, then such effective noise generator exists between the base and emitter, irrespective of the value of emitter load resistance that may be connected in the circuit. Amplification of noise results since the circuit performs as a grounded-emitter amplifier insofar as the noise is concerned—and this, irrespective of whether the output load is disposed in the emitter or in the collector circuit. The signal, however, will be degenerated in an emitter-follower stage, thus degrading the effective signal-to-noise ratio. Despite this fact, and despite the lack of improvement at the high frequency end, these are the types of circuits that the art has had to employ heretofore in vidicon amplifier stages and the like.

It is an object of the present invention to take advantage of the above-mentioned understanding of the effective positioning of the equivalent noise source, and to overcome the difficulties inherent in such prior-art vidicon or similar substantially constant current-source transistor amplifying systems.

A further object is to provide a new and improved transistor amplifier circuit.

Still an additional object is to provide a new and improved vidicon amplifying circuit.

Other and further objects will be explained hereinafter, and will be more particularly pointed out in the appended claims.

Figure 2:
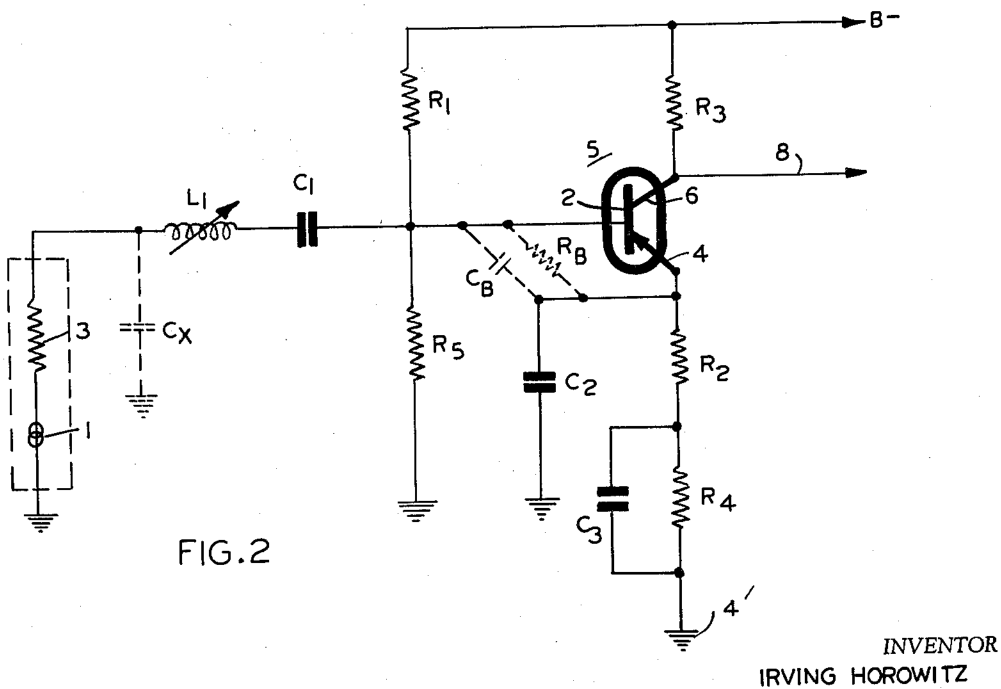

The invention will now be described in connection with the accompanying drawing, FIG. 1 of which is a schematic circuit diagram illustrating the invention in simplified, preferred form; and FIG. 2 is a similar diagram of the invention in a circuit embodying D.C. stabilization for temperature-controlling purposes.

Referring to FIG. 1, the vidicon or other substantially constant-current source is illustrated as a generator 1 of a relatively broad band of frequencies, ranging from low frequencies of the order of a few cycles, to high frequencies of the order, for example, of seven and one-half megacycles. The source 1 is shown provided with an effective internal high resistance 3 and an output capacitance $C_x$, illustrated in dotted lines. This source 1 is applied to an input transistor amplifier stage 5, that, in accordance with the present invention, and unlike prior-art vidicon amplifying circuits and the like, is not of the emitter-follower type, but, rather, is of a normal grounded emitter amplifying type, though provided with certain critical impedance relationships. The stage 5 comprises the base 2, emitter 4 and collector 6.

In accordance with the present invention, there is connected in the portion of the output circuits comprising the emitter-to-ground circuit, a resistance $R_2$ that is designed to have a value low compared with the base-to-emitter resistance $R_B$, at the low frequencies of the band. At the low frequencies, therefore, the product of the resistance $R_2$ and the current gain $\beta$ of the stage 5 represents the effective equivalent input resistance, so that the input resistance has been raised from that value which would normally exist as a result of the inherent base-to-emitter resistance $R_B$. A boosting of the low frequency voltages applied to the transistor is thus achieved, as is consequent improvement in the signal-to-noise ratio at the low frequencies. At the high frequencies, however, the circuit acts as a normal grounded-emitter amplifier. Shunting the resistor $R_2$ is a capacitor $C_2$ of a rather critical value; namely, a value that presents a relatively high impedance at the low frequencies, so that the resistor $R_2$ is the controlling element, and a relatively low impedance to serve as a by-pass at the high frequencies. The stage 5, at the high frequencies, thus acts as a normal amplifier of the grounded-emitter type having a relatively low input impedance.

Since the input capacitance of the transistor circuit is the sole effective impedance element, signal-wise, at the high frequencies, it is difficult to attain the before-mentioned desired broad-band peaking in order to improve the signal-to-noise ratio at the high end of the band. But the input resistance $R_B$ of the transistor 5 decreases with increasing frequency. The present invention thus makes use of this phenomenon to obtain such broad-band peakings at the high-frequency end by inserting, preferably in series, a peaking inductance $L_1$ that resonates at the high frequency end with the output capacitance $C_x$ of the substantially constant-current source 1, and the input capacitance $C_B$ between the base 2 and emitter 4 of the transistor 5. Such resonance preferably is adjusted to occur near the cut-off region. In the before mentioned example, this would be near seven and one-half megacycles. Through the utilization of this peaking circuit, the high-frequency signals are also boosted, thus improving the signal-to-noise ratio at the high end of the band. The input peaking circuit acts as a transformer at high frequencies, matching the constant-current source 1, 3, to the input of the transistor 5 by the ratio of $C_x$ to the larger input capacitance $C_B$. The large $L/C$ ratio of the tuned circuit allows this to happen over a broad band of frequencies because the impedance of the tuned circuit is high over such broad band:

The use of a relatively large peaking inductance $L_1$ though providing a relatively low Q, provides a high-gain response over a broad band, thereby achieving the desired end of broad-band high-frequency peaking.

The capacitor $C_1$ interconnecting the inductance $L_1$ and the base 2 is merely a D.C-isolating capacitor. Bias current for the base 2 is provided from the negative terminal B− of the current source, through resistor $R_1$, and collector bias is supplied through resistor $R_3$. The output circuit is traceable from the collector 6 through the output conductor 8 and the ultimate load, not shown, and thence back through to the ground terminal 4′ of the emitter 4.

In FIG. 2, the system is shown in more complete form. The base bias network includes the further resistor $R_5$ to ground, and the D.C.-stabilizing resistor $R_4$, inserted in the emitter circuit to ground, with its by-pass capacitor $C_3$. The capacitor $C_2$ then shunts both the resistors $R_2$ and $R_4$. The value of the resistor $R_2$ necessary to obtain the above-described results will, in general, be considerably smaller than the conventional value of the resistor $R_4$ employed for D.C. stabilization. In a typical circuit for use with a vidicon camera source 1, 3, for example, a 2N384-type transistor 5 has been employed, with the following circuit values, obtaining the improved perforance, before-described:

| | |
|---|---|
| $C_1$=.01 microfarads | $R_2$=100 ohms |
| $C_2$=1000 micro-microfarads | $R_3$=1000 chms |
| $C_3$=25 microfarads | $R_4$=6.8K ohms |
| $R_1$=100K ohms | $R_5$=68K ohms |

Further modifications will occur to those skilled in the art, and all such are considered to fall within the spirit and scope of the invention, as defined in the appended claims.

What is claimed is:

1. An amplifier for a substantially constant-current source of a broad band of frequencies ranging from relatively low to relatively high frequencies having, in combination, a transistor amplifier provided with at least a base, an emitter and a collector, an input circuit connected to the base and an output circuit connected between ground and the collector, means for connecting the substantially constant-current signal source to the input circuit and comprising an inductance tuned with the inherent output capacitance of the source and the base-to-emitter capacitance of the transistor to resonate at a predetermined one of the said high frequencies, an emitter load of impedance small compared with the base-to-emitter input resistance at the said low frequencies, and a capacitance shunting the said load and of high impedance at the said low frequencies but low impedance at the said high frequencies.

2. An amplifier as claimed in claim 1 and in which there is connected in circuit with the emitter load a direct-current stabilizing resistance of value greater than the said load impedance.

3. An amplifier as claimed in claim 2 and in which the said capacitance shunts both the said emitter load and stabilizing resistance.

References Cited in the file of this patent

UNITED STATES PATENTS

| | | |
|---|---|---|
| 2,370,399 | Goodale | Feb. 27, 1945 |
| 2,609,460 | Wheeler | Sept. 2, 1952 |
| 2,691,074 | Eberhard | Oct. 5, 1954 |
| 2,812,390 | Van Overbeek | Nov. 5, 1957 |
| 2,919,313 | Johnson | Dec. 21, 1959 |